(12) United States Patent
Sung

(10) Patent No.: US 7,482,238 B2
(45) Date of Patent: Jan. 27, 2009

(54) METHOD FOR MANUFACTURING SEMICONDUCTOR DEVICE

(75) Inventor: Woong Je Sung, Bucheon (KR)

(73) Assignee: Dongbu Electronics, Co., Ltd., Seoul (KR)

( * ) Notice: Subject to any disclaimer, the term of this patent is extended or adjusted under 35 U.S.C. 154(b) by 351 days.

(21) Appl. No.: 11/320,903

(22) Filed: Dec. 30, 2005

(65) Prior Publication Data

US 2006/0145284 A1 Jul. 6, 2006

(30) Foreign Application Priority Data

Dec. 31, 2004 (KR) ............... 10-2004-0118451

(51) Int. Cl.
*H01L 21/331* (2006.01)
(52) U.S. Cl. ............... 438/335; 257/E21.424
(58) Field of Classification Search ............ 257/107, 257/133, 139, 141, 499, 557, 558, 559, 560, 257/561, 562, 563, 564, E21.424, E21.425, 257/E21.426, E21.427, E21.428; 438/309, 438/312, 313, 316, 322, 327, 335
See application file for complete search history.

(56) References Cited

U.S. PATENT DOCUMENTS 4,963,951 A * 10/1990 Adler et al. ............... 257/141
5,661,043 A * 8/1997 Rissman et al. ............ 438/162

* cited by examiner

*Primary Examiner*—Evan Pert
*Assistant Examiner*—Kevin Quinto
(74) *Attorney, Agent, or Firm*—McKenna Long & Aldridge LLP

(57) ABSTRACT

A method for manufacturing a semiconductor device includes steps of injecting a hole current into an N drift region while a constant voltage is applied to a $P^+$ anode of a lateral insulated gate bipolar transistor, such that a majority of the hole current passes through a $P^+$ cathode of the lateral insulated gate bipolar transistor via a $P^+$ buried layer. Therefore, a hole-current path located under an $N^+$ cathode area of a LIGBT structure is eliminated, thus securing sufficient latch-up current density.

1 Claim, 1 Drawing Sheet

METHOD FOR MANUFACTURING SEMICONDUCTOR DEVICE

This application claims the benefit of Korean Patent Application No. 10-2004-0118451, filed on Dec. 31, 2004, which is hereby incorporated by reference for all purposes as if fully set forth herein.

BACKGROUND OF THE INVENTION

1. Field of the Invention

The present invention relates to semiconductor devices, and more particularly, to a method for manufacturing a semiconductor device, which eliminates a hole-current path located under an $N^+$ cathode area of a lateral insulated gate bipolar transistor (LIGBT) structure. A sufficient latch-up current density is thereby secured.

2. Discussion of the Related Art

A bipolar-mode field effect transistor (FET) includes a structure having a vertical junction FET. The bipolar-mode FET is used as a power semiconductor device exhibiting high current capacity, low on-resistance, and high switching speed. Due to a conductivity modulation effect of an epitaxial layer, bipolar-mode FETs exhibit a higher current gain and a lower saturation voltage than a bipolar junction transistor. Since an element structure has no junction along a current path, a bipolar-mode FET has a higher switching speed than a MOS-gate driven power device. An important design parameter of the bipolar-mode FET includes its gate structure, in which a gate length is equal to a channel length or the distance between gates. Another important design parameter includes the impurity density of an epitaxial layer. These parameters determine a normal-off characteristic, current gain, and switching capacity.

Also, lateral power devices are suitable for power IC applications. A device on a semiconductor-on-insulator substrate is implemented and has excellent characteristics, superior to those of a junction isolation device, such as a lower leakage current, a higher integration degree, and a higher removal rate of parasitic components. Lateral power devices include a lateral double-diffused MOS device, which has a very high on-resistance, and a MOS-gate bipolar power device, such as an LIGBT device or a lateral MOS-controlled thyristor, which has a very long turn-off time due to a recombination of minor carriers.

FIG. 1 illustrates a semiconductor device having a related art LIGBT structure including a gate 106, a cathode 107, and an anode 105 deposited on a P-type semiconductor silicon substrate 101. A PNP bipolar transistor is composed of a $P^+$ anode 104, a N drift region 102, and a $P^+$ cathode 103. In an "on" state of the PNP bipolar transistor, a hole current ($I_h$) is injected into the $P^+$ anode 104 and passes the $P^+$ cathode via a P-type base area located under the $N^+$ cathode 108, that is, through a base resistance $R_B$. If a voltage drop of $R_B \times I_h$ exceeds approximately 0.7V, a parasitic NPN bipolar transistor composed of the $N^+$ cathode 108, the P-base area, and the N drift region 102 operates in a condition referred to as a latch-up. If the parasitic NPN bipolar transistor enters a latch-up mode, the transistor is no longer controllable by the voltage level of the gate 106.

SUMMARY OF THE INVENTION

Accordingly, the present invention is directed to a method for manufacturing a semiconductor device that substantially obviates one or more problems due to limitations and disadvantages of the related art.

An advantage of the present invention is to provide a method for manufacturing a semiconductor device, which eliminates a hole-current path under an $N^+$ cathode area of an LIGBT structure, thereby securing a sufficient amount of an increased latch-up current density.

Additional features and advantages of the invention will be set forth in the description which follows, and in part will be apparent from the description, or may be learned by practice of the invention. The objectives and other advantages of the invention will be realized and attained by the structure method particularly pointed out in the written description and claims hereof as well as the appended drawings.

To achieve these and other advantages and in accordance with the purpose of the present invention, as embodied and broadly described, a method for manufacturing a semiconductor device includes injecting a hole current into an N drift region while a constant voltage is applied to a $P^+$ anode of a lateral insulated gate bipolar transistor, such that a majority of the hole current passes through a $P^+$ cathode of the lateral insulated gate bipolar transistor via a $P^+$ buried layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiment(s) of the invention and together with the description serve to explain the principles of the invention. In the drawings.

DETAILED DESCRIPTION OF THE INVENTION

Reference will now be made in detail to exemplary embodiments of the present invention, examples of which are illustrated in the accompanying drawings. Wherever possible, like reference designations will be used throughout the drawings to refer to the same or similar parts.

A bipolar-mode FET, which serves as a short-channel junction FET, transmits a forward voltage to a gate junction and thereby increases the current driving capability. The current driving capability is increased due to the conductivity modulation of a drift area. The bipolar-mode FET has a low forward voltage drop and a high switching speed. The bipolar-mode FET can be used as a switching element at higher voltages and at higher frequencies than other bipolar power devices.

A related art lateral structure is unsuitable for a power IC because high levels of parasitic capacitance result from the vertical PN junction of a conventional bipolar-mode FET formed on a semiconductor substrate. On the other hand, a silicon-on-insulator technique may be used for power ICs due to its low parasitic capacitance. The silicon-on-insulator technique enables high-speed operation, low levels of leakage current, and high-temperature operation. Therefore, lateral power devices based on silicon-on-insulator substrates may be used in power ICs, including MOS-gate lateral power devices such as an LIGBT device, a lateral MOS-controlled thyristor, and a lateral double-diffused MOS.

Figure 1:
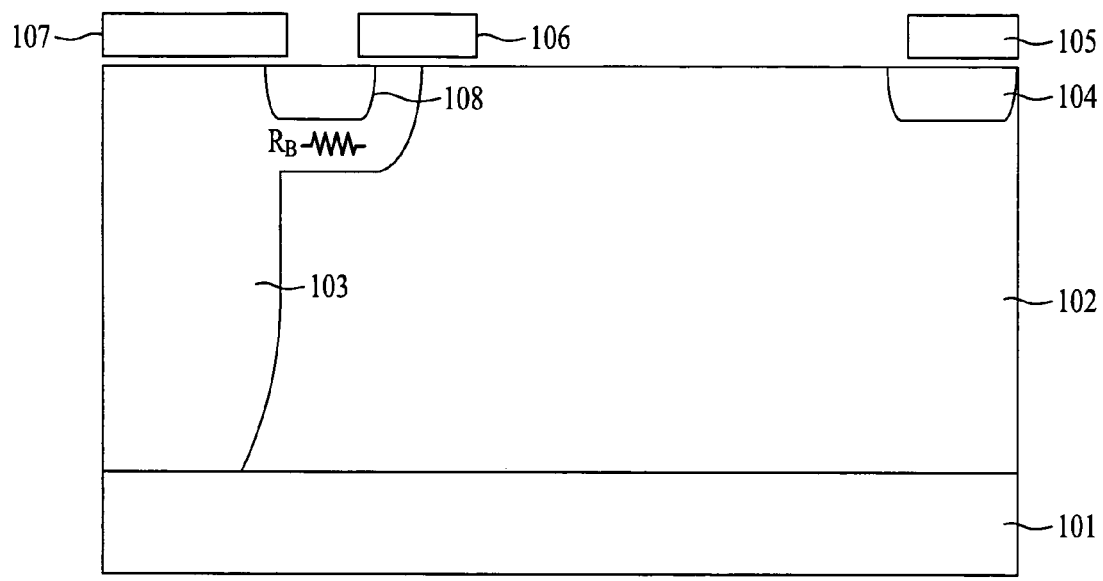
FIG. 1 is a cross-sectional view of a related art semiconductor device.
Figure 2:
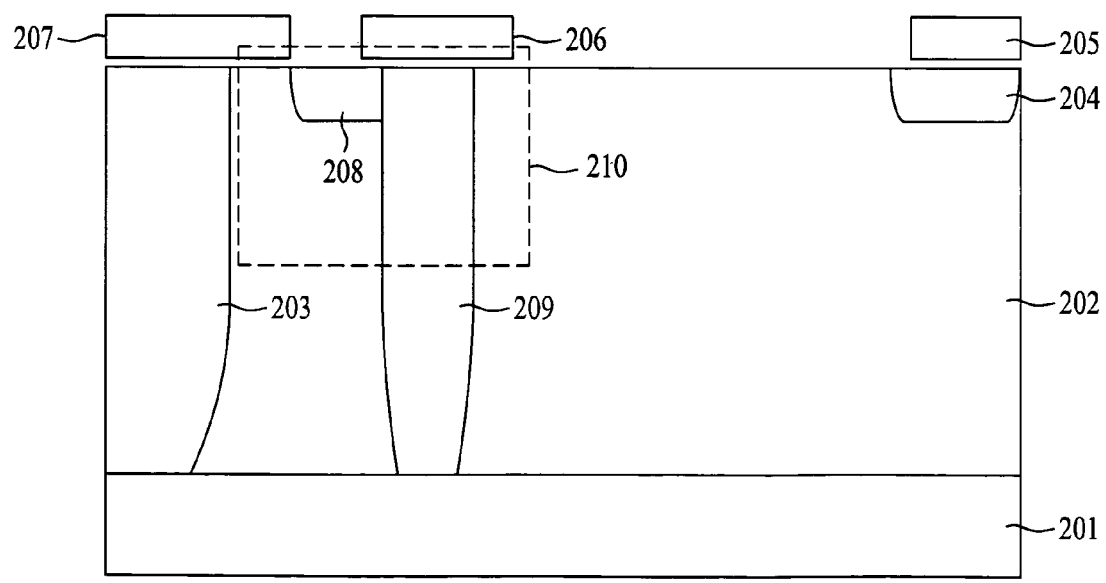
FIG. 2 is a cross-sectional view of a semiconductor device according to an exemplary embodiment of the present invention.

FIG. 2 illustrates a semiconductor device according to an embodiment of the present invention. FIG. 2 illustrates a LIGBT device composed of a cathode 207, a gate 206, and an anode 205. This is an improved LIGBT device capable of eliminating a voltage drop due to the resistance of a P-base area 209 and a hole current passing through the resistance of the P-base area 209, shown in region 210. That is, in contrast to the related art device, the device of FIG. 2 has no current path under an N+ cathode 208. Therefore, though a high current may flow in the device of an exemplary embodiment of the present invention, a parasitic NPN bipolar transistor is not activated because there is no resistance $R_B$ in the P-base area. Assuming a constant voltage is applied to the P+ anode 204, the hole current is injected into an N drift region 202, and a majority of the hole current passes through a P+ cathode 203 via a P+ buried layer 201. Therefore, since there is no current path under the N+ cathode 208, there is no resistance $R_B$ and no voltage drop of $R_B \times I_h$. Thus, latch-up conditions are thereby prevented.

The improved LIGBT device according to an exemplary embodiment of the present invention thus eliminates a hole-current path that is present under the N+ cathode area in a related art device, thereby enabling at least three times the latch-up current density.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A method for manufacturing and operating a semiconductor device, comprising:

forming a P+ buried layer;

forming an N drift region formed over the P+ buried layer;

forming a cathode, a gate, and an anode over the P+ buried layer, the cathode, the gate, and the anode being spaced apart from each another;

forming a P+ cathode below the cathode and over the P+ buried layer;

forming a P-base area below the gate and over the P+ buried layer, the P-base are being spaced apart from the P+ cathode;

forming a P+ anode below the anode and over the P+ buried layer;

forming a N+ cathode over the P+ buried layer and between the cathode and gate, wherein the P-base area is not formed below the N+ cathode; and injecting a hole current into the N drift region while a constant voltage is applied to the P+ anode, such that a majority of the hole current passes through the P+ cathode of via the P+ buried layer.

* * * * *